United States Patent
Baccini

(10) Patent No.: US 6,711,997 B1
(45) Date of Patent: Mar. 30, 2004

(54) DEVICE TO PRODUCE ELECTRONIC CIRCUITS

(76) Inventor: Gisulfo Baccini, Via Duca d'Aosta, 1-31030 Mignagola di Carbonera (IT)

(*) Notice: Subject to any disclaimer, the term of this patent is extended or adjusted under 35 U.S.C. 154(b) by 0 days.

(21) Appl. No.: 09/538,696

(22) Filed: Mar. 30, 2000

(30) Foreign Application Priority Data

Apr. 2, 1999 (IT) .................................... UD99A0073

(51) Int. Cl.$^7$ ............................................ B05C 17/06
(52) U.S. Cl. ..................................... 101/128; 101/424.1
(58) Field of Search ............................ 101/128, 127.1, 101/128.1, 127, 126, 424.1; 427/96, 282, 294; 118/406; 34/194, 192, 195, 197

(56) References Cited

U.S. PATENT DOCUMENTS

| | | | | |
|---|---|---|---|---|
| 3,976,301 A | * | 8/1976 | Corbett et al. | 369/35.01 |
| 4,884,738 A | * | 12/1989 | Bourrieres | 228/180.2 |
| 5,314,711 A | * | 5/1994 | Baccini | 427/97 |
| 5,553,536 A | * | 9/1996 | Van Os | 101/44 |
| 5,637,148 A | * | 6/1997 | Kuster et al. | 118/64 |
| 5,669,494 A | * | 9/1997 | Geffen | 206/309 |
| 6,109,323 A | * | 8/2000 | Baccini | 156/378 |
| 6,115,939 A | * | 9/2000 | Kuster | 34/194 |
| 6,369,970 B1 | * | 4/2002 | Steinhoff et al. | 360/75 |

FOREIGN PATENT DOCUMENTS

| | | |
|---|---|---|
| EP | 0 535 338 A1 | 4/1993 |
| EP | 0 578 061 A1 | 1/1994 |
| JP | 60130740 A | 7/1985 |
| JP | 09232777 A | 9/1997 |
| JP | 09272176 A | 10/1997 |
| JP | 11020358 A | 1/1999 |
| JP | 11047668 A | 2/1999 |
| WO | WO 98/48601 A1 | 10/1998 |

* cited by examiner

*Primary Examiner*—Andrew H. Hirshfeld
*Assistant Examiner*—Anthony H. Nguyen
(74) *Attorney, Agent, or Firm*—Akin, Gump, Strauss, Hauer & Feld, L.L.P.

(57) ABSTRACT

Device to produce electronic circuits of the type comprising at least a base support (12) on which electrically conductive material is deposited able to embody the conductor tracks, said device comprising at least a printing station (13) able to deposit said electrically conductive material on said base support (12), a drying oven (14) and first feed means (35, 60) to feed each base support (12) from said printing station (13) to said drying oven (14), stacking means (52) being provided to stack the base supports (12) one on top of the other so that said base supports (12) can be introduced in vertical piles into said drying oven (14), spacer means (18, 20) being provided to keep said base supports (12) separate from each other when stacked.

25 Claims, 6 Drawing Sheets

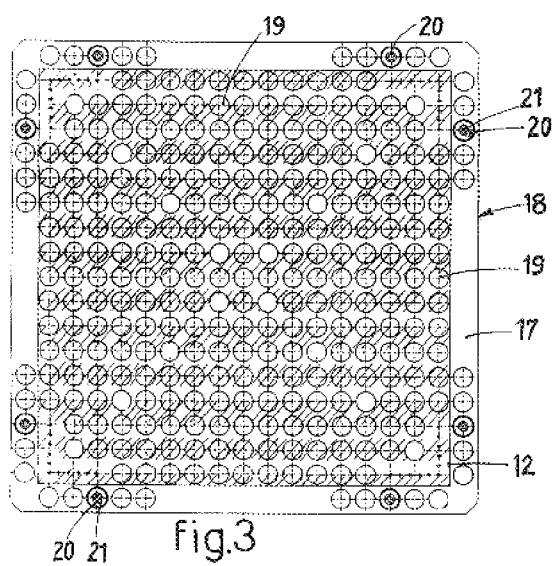
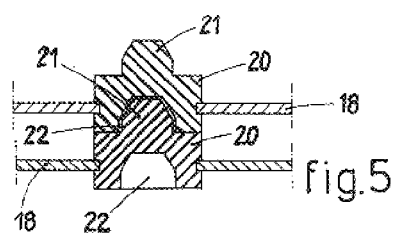
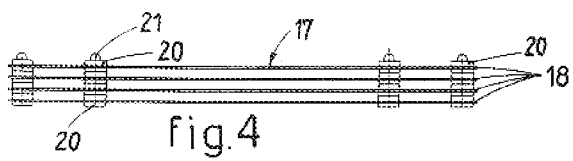
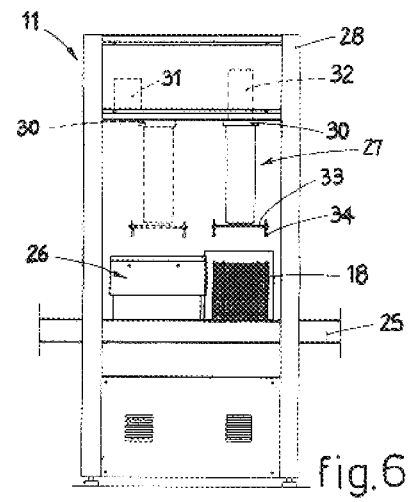

DEVICE TO PRODUCE ELECTRONIC CIRCUITS

FIELD OF THE INVENTION

This invention concerns a device to produce electronic circuits, particularly those comprising a base support consisting of very thin sheets of alumina and plastic materials, commonly known as "green-tape".

The device according to the invention is able to process, in a completely automatic fashion, sheets of green-tape, already cut to measure according to the final destination of the circuit or electronic plate to be produced, to perform three operations: to deposit the conductor material by means of serigraphy, the drying operation in the oven, and also the cooling operation. In this way the product which emerges from the device is ready for the subsequent working steps, that is to say, the assembly of several supports to achieve multi-layer circuits, and/or the assembly of the electronic components.

BACKGROUND OF THE INVENTION

One of the techniques well-known in the production of electronic circuits is to use as a base support one or more sheets of insulating material, consisting of alumina or synthetic materials, according to the green-tape technology.

The green-tape supports are normally arranged on rectilinear guides along which they are fed in sequence, by means of a feed mechanism, from a loading station to a printing station where, by means of serigraphy, the conductor material is deposited thereon, in the form of a conductor paste, according to a pre-defined mask. Subsequently, each support is introduced into a drying oven, where it is kept at a temperature of at least 120° C. for the time needed to make the conductor paste set, which time at present is at least ten minutes.

After the drying operation in the oven, the supports are cooled in a suitable cooling chamber and then discharged from the device.

Conventional devices have the disadvantage of being very bulky, with a linear development of several tens of meters. This depends on the fact that all the steps described above occur in serial sequence, and that in the drying oven alone the line develops for more than 10 meters.

In fact, if we consider that the time needed to perform a single serigraphy operation is about 10 seconds, and that the length of each support is several tens of centimeters, we can see that the average speed of feed of the supports along the rectilinear guides is about 1–1.5 m/min.

Consequently, as we have seen, each support must stay inside the drying oven for at least 10 minutes, and the development of the line inside the drying oven may be even more than 10 meters.

The state of the art includes devices with a linear-type drying oven, that is, more than 10 meters long, with consequent disadvantages from the point of view of bulk, and also devices where the drying oven develops partly upwards. In this latter type, there is a conveyor belt system inside arranged in a coil, on which brackets are attached; on each bracket one or more supports to be dried are rested. This second solution has the disadvantage that it is both complex and expensive, and requires that the supports which are to be dried are handled, in order to arrange them on the brackets of the oven and to remove them therefrom.

The present Applicant has devised and embodied the device to produce electronic circuits according to the invention to overcome these shortcomings.

SUMMARY OF THE INVENTION

The device to produce electronic circuits according to the invention is set forth and characterized in the main claim, while the dependent claims describe other innovative characteristics of the invention.

One purpose of the invention is to achieve a device to produce electronic circuits which is simple and not cumbersome, and which, at the same time ensures high quality.

Another purpose of the invention is to achieve a device to produce electronic circuits wherein all the operations to deposit the conductor paste, and the drying and cooling steps are carried out automatically and very quickly, so as to obtain a high hourly productivity.

In accordance with this purpose, the device according to the invention, to produce electronic circuits of the type comprising at least a base support on which electrically conductive material is deposited, able to embody the conductor tracks, comprises at least a printing station able to deposit the electrically conductive material onto the base support, a drying oven and feed means to feed each base support from the printing station to the drying oven. According to one characteristic of the invention, stacking means are provided to stack the base supports one on top of the other, after they have been processed in the printing station, so that they can be introduced in vertical piles into the drying oven, and spacer means are provided to keep the base supports separate from each other when stacked.

According to one characteristic of the invention, the drying oven comprises a drying chamber inside which at least one pile of base supports is able to be inserted, and means to circulate a current of hot air in a direction transversal to the pile, so that a plurality of base supports, with the relative electronic circuits deposited thereon, can be dried simultaneously.

According to another characteristic of the invention, the drying oven is of the modular type, so that two or more modules can be placed adjacent to each other in a longitudinal direction, that is, in the direction of feed of the base supports.

According to another characteristic of the invention, downstream of the drying oven there is a cooling unit through which each pile of base supports is fed in such a manner that it can be lapped by a current of cold air, in a direction transversal to the pile, so that a plurality of base supports, with the relative electronic circuits deposited thereon, can be cooled simultaneously.

According to another characteristic of the invention, the feed means for the base supports comprise a first rectilinear guide able to guide the base supports, one in front of the other and separated by a determined pitch, from the printing station towards the stacking means, and a second rectilinear guide able to guide the piles of base supports, one in front of the other and separated by the same pitch, from the stacking means to a collection station through the drying oven.

According to another characteristic of the invention, the printing station is displaced laterally with respect to the rectilinear guide of the base supports, and transverse feed means are provided to move the base supports transversely, one at a time, from the rectilinear guide to the printing station and vice versa.

According to another characteristic of the invention, the device is able to manage advantageously other base supports of a flexible type, for example of the green-tape type. In order to do this, the spacer means comprise a rigid supporting plate for each base support, on the upper surface of which a base support is able to be rested.

BRIEF DESCRIPTION OF THE DRAWINGS

These and other characteristics of the invention will become clear from the following description of a preferential form of embodiment, given as a non-restrictive example, with reference to the attached drawings wherein:

FIG. 3 is a plane view of a supporting plate for the base supports of the electronic circuits processed by the device shown in FIG. 1;

FIG. 4 is a side view of some plates from FIG. 3, stacked on top of each other;

FIG. 5 is a section of an enlarged detail of FIG. 4;

FIG. 6 is a left side view of the device in FIG. 1;

DETAILED DESCRIPTION OF PREFERRED EMBODIMENT

Figure 1:
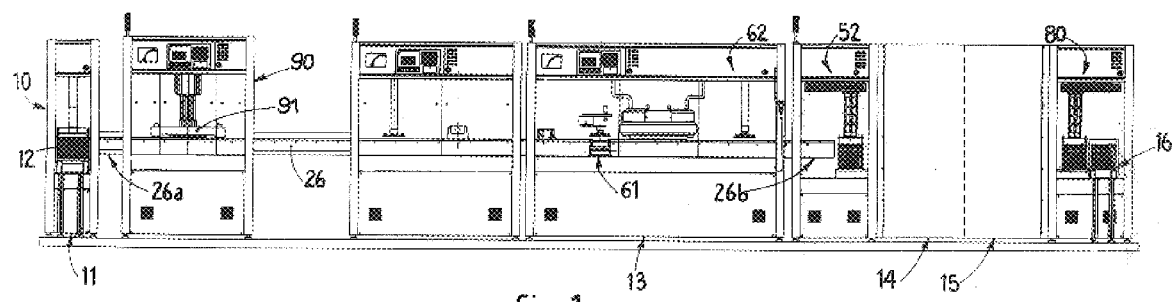
FIG. 1 is a side view of a device to produce electronic circuits according to the invention.
Figure 2:
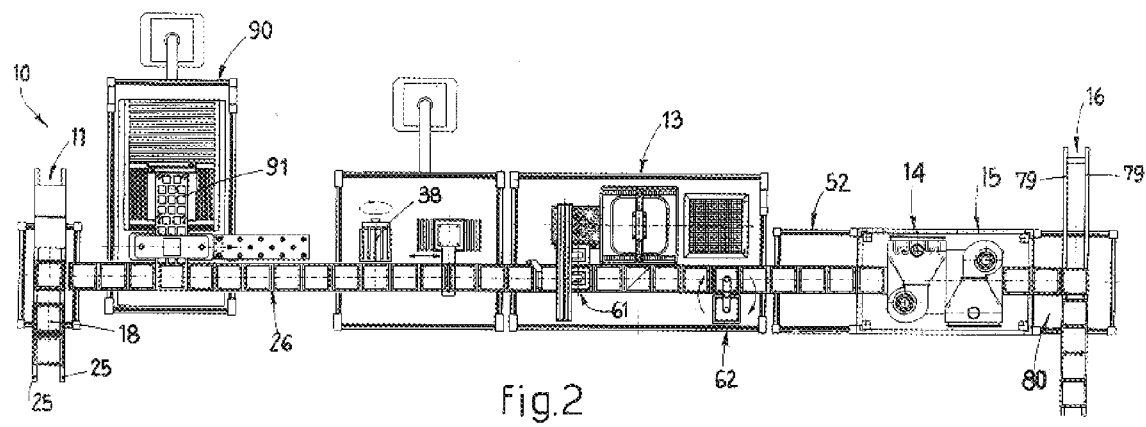
FIG. 2 is a plane view of the device shown in FIG. 1.

With reference to FIGS. 1 and 2, a device 10 to produce electronic circuits according to the invention comprises a loading station 11, where a plurality of base supports 12 for electronic circuits is able to be located to be subsequently processed, a printing station 13, a drying oven 14, a cooling unit 15 and a collection station 16, arranged aligned with each other.

Each base support 12 consists, for example, of one or more flexible sheets, very thin, in the region of several tenths of a millimeter, of insulating material, such as alumina or plastic material, obtained with the green-tape technology.

Each support 12 is regular in shape, square or rectangular, and of a standard size for the electronics industry, usually expressed in inches, for example 4"×4", 6"×6", 8"×8" or 11"×11". It is obvious, however, that the device 10 according to the invention is also able to process supports 12 of any other shape and size.

According to one characteristic of the invention, the supports 12, although flexible, are able to be stacked one on top of the other.

To allow them to be stacked, each support 12 is able to be rested on the plane surface 17 (FIGS. 3 and 4) of a metal supporting plate 18, about 1 mm thick and provided with a plurality of through holes 19.

The plates 18 are kept separate from each other by cylindrical spacers 20, each provided with a central pin shaped like a truncated cone, able to couple with a corresponding cavity 22, also shaped like a truncated cone (FIG. 5), of the spacer above, so as to achieve a precision male-female coupling. The spacers 20 can be positioned as desired on the holes 19 of the plate 18 and some of them are able to perform the function of lateral stopper elements for the support 12 resting on the surface 17.

The plates 18 are rigid and light, and for this reason can be stacked on top of each other in large numbers, so that piles of more than 40 base supports 12 can be achieved.

The loading station 11 comprises two horizontal guides 25 (FIG. 6), arranged transverse with respect to two rectilinear guides 26, also horizontal, along which the supports 12, mounted on the plates 18, are able to be guided into proximity with the drying oven 14. One or more piles of plates 18, with the relative supports 12 to be processed, are able to be arranged on the guides 25.

The loading station 11 also comprises a pick-up device 27, mounted on a stationary frame 28 and able to pick up from the pile of plates 18, the plate which is momentarily on top, in order to deposit it on the left end 26a (FIG. 2) of the rectilinear guides 26.

The pick-up device 27 comprises a trolley 30, commanded by a linear motor 31 to slide horizontally on the frame 28 between a pick-up position shown by a continuous line in FIG. 6, and a release position shown by a line of dashes in FIG. 6.

A linear motor 32 is mounted on the trolley 30, able to vertically displace a lower plate 33 provided with suckers 34, connected to a pneumatic mechanism of a conventional type and not shown in the drawings. The suckers 34 are able to adhere selectively to the plate 18 to be picked up from the pile. To be more exact, the suckers 34 cooperate with the perimeter zones of the plates 18, where the support 12 does not rest.

Figure 7:
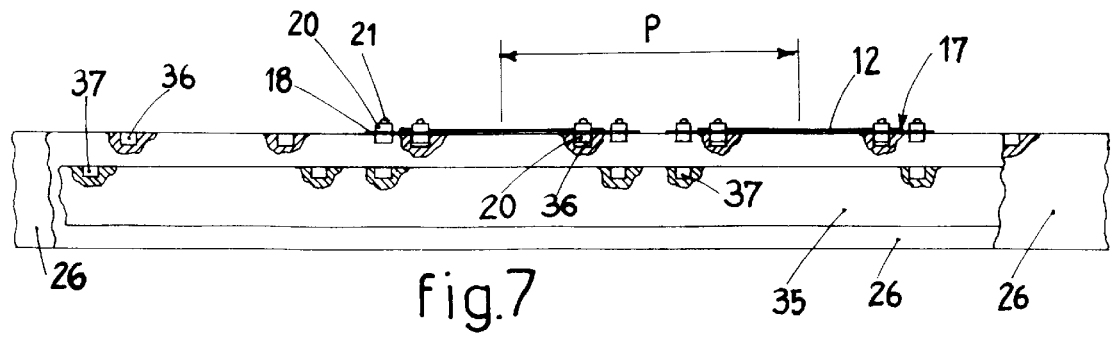
FIG. 7 is a side view of a first enlarged detail of the device in FIG. 1.
Figure 8:
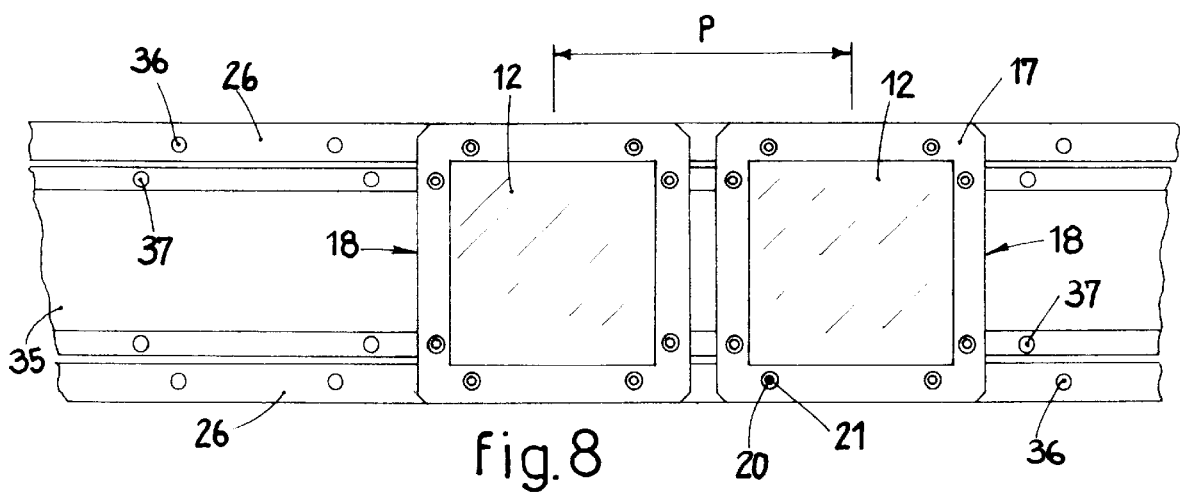
FIG. 8 is a view from above of FIG. 7.
Figure 9:
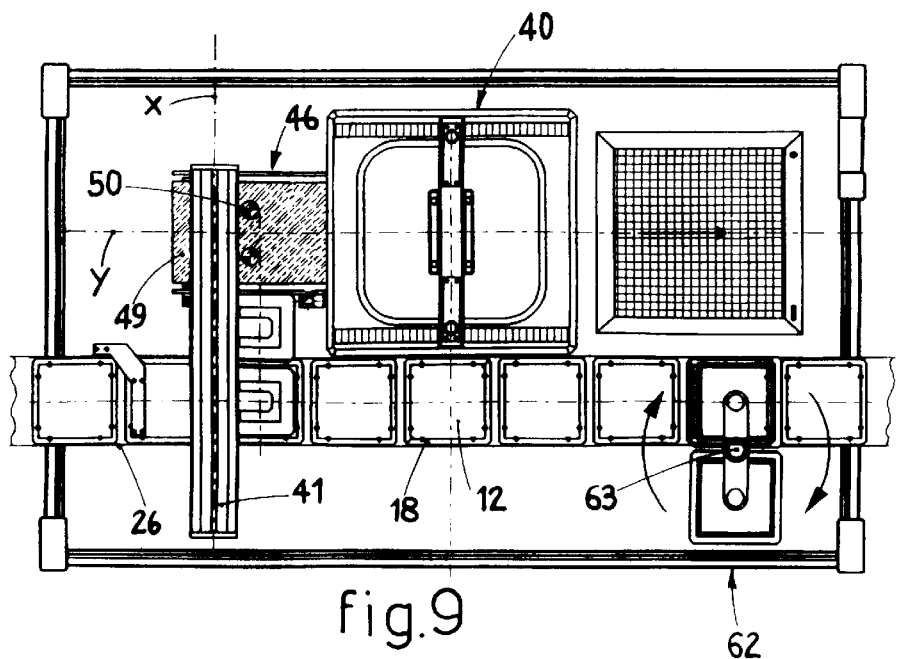
FIG. 9 is a second enlarged detail of the device in FIG. 1.
Figure 10:
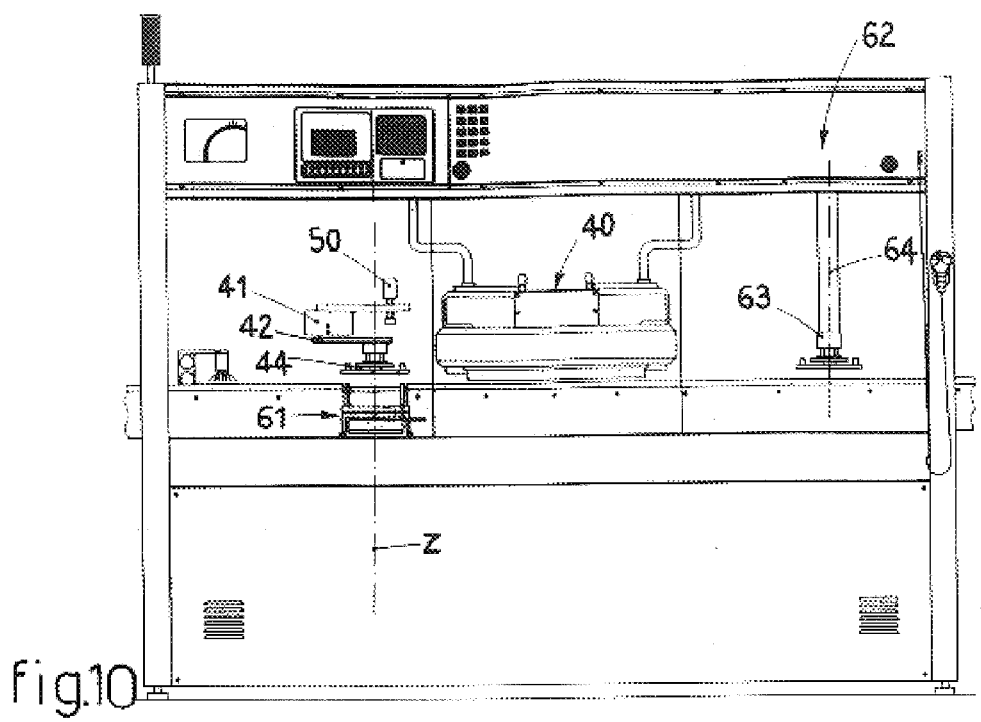
FIG. 10 is a side view of the detail shown in FIG. 9.
Figure 11:
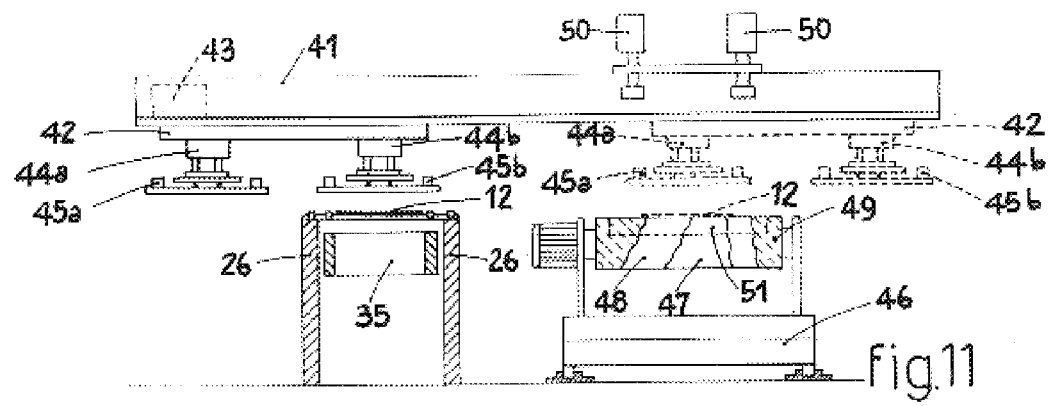
FIG. 11 is a transverse view of the detail shown in FIG. 9.
Figure 12:
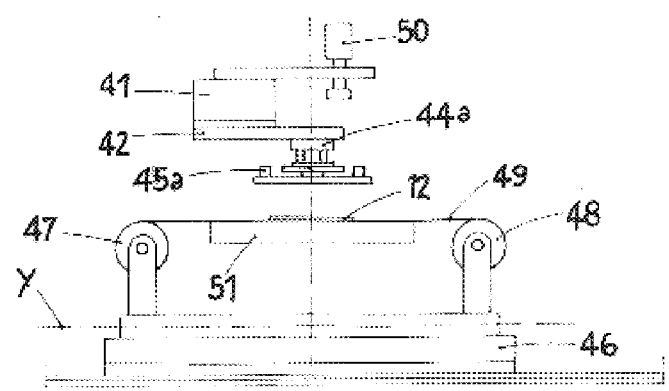
FIG. 12 is a side view of FIG. 11.

The plates 18, and the supports 12 which they carry, are fed from the loading station 11 to the printing station 13, and from the latter to the drying oven 14, by means of a metal bar 35 (FIGS. 7 and 8), parallel to the guides 26 and connected to a linear motor 38 (FIG. 2), which is able to feed the bar 35 step-by-step, in a conventional manner, according to the technique known as "the pilgrim's progress".

To this purpose, both the guides 26 and the bar 35 are provided with hollows 36 (FIGS. 7 and 8), respectively 37, able to cooperate with the spacers 20 of the plates 18 to position them precisely and, respectively, lift them and translate them.

Each feed cycle of the bar 35 is able to displace all the plates 18 which are on the guides 26 by one elementary step p towards the right end 26b; this elementary step is equal to the interaxis between two adjacent plates 18.

The printing station 13 comprises a serigraphy unit 40, arranged adjacent to the guides 26 and able to deposit, in a conventional manner according to the serigraphy technique, a conductor paste on the upper surface of the base support 12, according to a pre-established pattern or mask, to thus embody the conductor tracks of the electronic circuit.

The printing station 13 also comprises a bar 41 (FIGS. 9–12) arranged transverse to the guides 26, on which a sliding trolley 42 is mounted, commanded by a linear motor 43.

Two pneumatic devices 44a and 44b are mounted on the trolley 42, provided with suckers 45a, respectively 45b.

The printing station 13 also comprises a positioning and centering board 46, able to move along the horizontal axes x and y, orthogonal to each other, and to rotate on the horizontal plane with respect to the vertical axis z (rotation θ). The commands are imparted to the board 46 by conventional means, not shown in the drawings.

The device 44a is able to lift each support 12 with respect to the corresponding supporting plate 18 and to deposit it on the board 46, before the serigraphy step. For this reason the suckers 45a can be positioned at any point whatsoever of the support 12, which is not yet equipped with the conductor tracks.

The device 44b, on the contrary, is able to lift each support 12 from the board 46, after the serigraphy step, and to deposit it on the same supporting plate 18 from which it was taken. For this reason the suckers 45b are necessarily positioned in zones of the support 12 outside the conductor tracks which have just been deposited.

Electronic TV cameras 50 are provided in correspondence with the board 46 to optically identify determined reference points on the support 12, called "fiducial", and to orient the board 46 in the three directions x, y and θ, so that the support 12 is exactly positioned with respect to the serigraphy unit 40.

Two rollers 47 and 48 are mounted rotatable on the board 46; a strip of paper 49, able to support the base support 12 during the serigraphy step, is wound onto said rollers 47, 48.

Below the rectilinear segment of the strip of paper 49, between the two rollers 47 and 48 there is a suction device 51 which holds the corresponding support 12 selectively adherent to the strip 49.

Translation means of a conventional type are also provided to translate the board 46 along the axis y and move it, together with the support 12, below the serigraphy unit 40.

Associated with the printing station 13, in correspondence with the guides 26, a weighing unit 61 is mounted, able to weigh each plate 18 and the relative support 12 by means of an electronic scales of a conventional type, both before the conductor paste has been deposited and also afterwards, to check that the weight of material deposited corresponds exactly to the pre-set weight.

Between the printing station 13 and the drying oven 14 there is a control station 62, in which a mechanism 63, rotating around a vertical axis 64 and provided with suckers which can be selectively activated, is able to selectively remove from the line, that is, from the guides 26, one of the supports 12, together with the relative plate 18, and take it through a rotation of 180° around the axis 64, to the control position, in front of the guides 26, where it can be subjected to a check by the workers entrusted with this task.

The device 10, in correspondence with the end 26b of the guides 26, upstream of the drying oven 14, comprises a stacking device 52 (FIGS. 1, 2 and 13) for the supporting plates 18; this device 52 is able to pick up each plate 18 arriving from the printing station 13 and to stack it, one on top of the other, onto lower guides 53, identical to the guides 26 and also horizontal but arranged lower, which pass through the drying oven 14 and the cooling unit 15.

Figure 13:
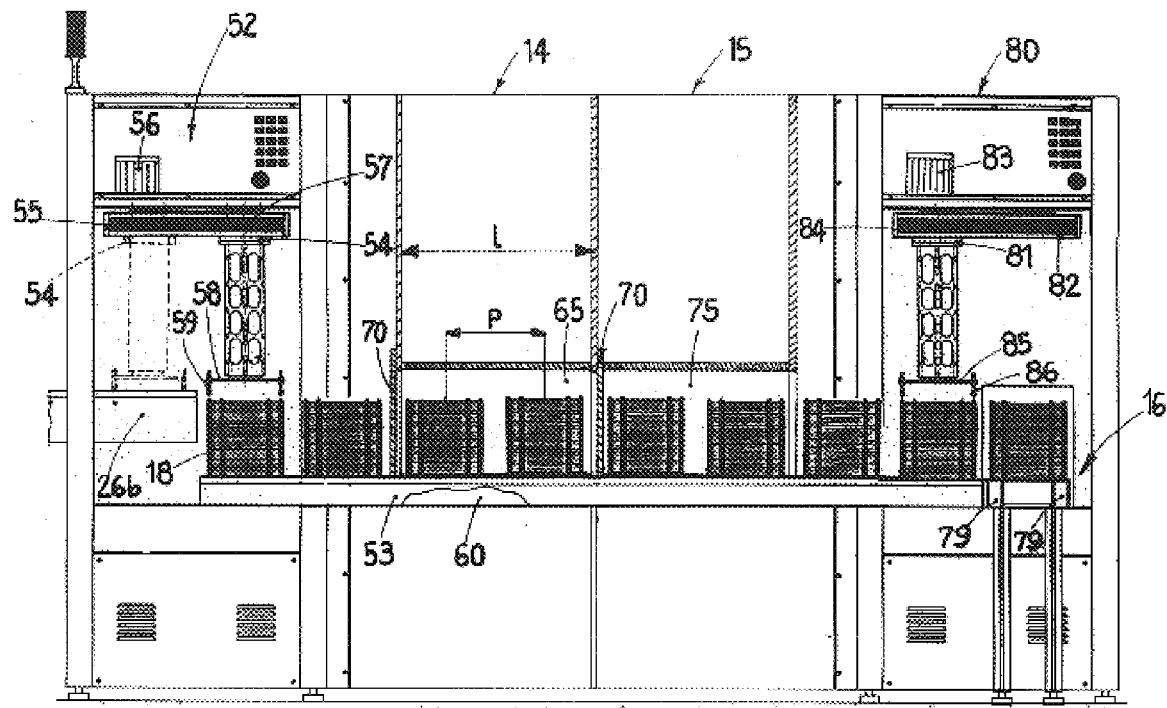
FIG. 13 is a side view of a third enlarged detail of the device in FIG. 1.

The stacking device 52 (FIG. 13) is similar to the pick-up device 27 and comprises a trolley 54 able to slide horizontally on an upper bar 55, on the command of a linear motor 56, between a stacking position and an adjacent pick-up position shown with a line of dashes in FIG. 13.

A linear motor 57 is mounted on the trolley 54, able to vertically displace a lower plate 58 provided with suckers 59, connected to a pneumatic mechanism of a conventional type and not shown in the drawings. Like the suckers 34, the suckers 59 are also able to adhere selectively to the plate 18 to be picked up from the guides 26, cooperating with the perimeter zones where the support 12 does not rest.

The piles of plates 18 and the supports 12 carried thereby are fed through the drying oven 14 and the cooling unit 15 by a horizontal metal bar 60; this occurs in an identical way to the step-by-step feed achieved by the metal bar 35.

To this purpose, both the guides 53 and the bar 60 are provided with upper hollows identical to the hollows 36 and able to cooperate with the spacers 20 of the plates 18 which are at the bottom of each pile to position them precisely and, respectively, lift them and translate them.

Therefore, each feed cycle of the bar 60 is able to displace all the piles of plates 18 which are on the guides 53 by one elementary step p towards the collection station 16.

Figure 15:
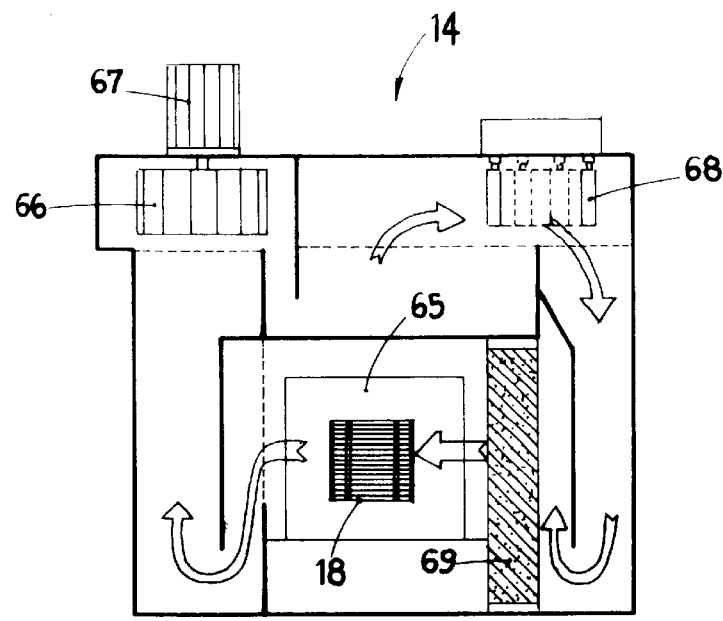
FIG. 15 is a transverse view of a drying oven of the device in FIG. 1.

The drying oven 14, or drying module, comprises a central drying chamber 65 (FIGS. 13 and 15), substantially cubic in shape, with a length l equal to about double the step p between two piles of plates 18. The oven 14 also comprises a fan 66 (FIG. 15), made to rotate by an electric motor 67, to create a current of air in a transverse direction inside the chamber 65, a series of electric resistors 68 to heat the air to a temperature which can be regulated up to and beyond 300° C., and at least a vertical filter 69 arranged at the inlet to the central drying chamber 65.

The current of hot air passes through each pile of plates 18 horizontally; thanks to the distance between each plate 18 and the plate above, it provides to simultaneously dry all the electronic circuits deposited on the individual supports 12.

At inlet to and at outlet from the central drying chamber 65 there are shutters 70, which can be selectively raised and lowered by means of actuators of a conventional type and not shown in the drawings, to open and respectively close the chamber 65.

The supports 12, on which the conductor paste to form the electronic circuit has already been deposited, are able to remain for about ten minutes inside the oven 14. This time, however, is not fixed, and is normally established by the companies which supply the conductor paste employed.

Considering that inside the chamber 65 of the drying module 14 there are two piles of plates 18 at the same time, with the relative supports 12, the piles advance by one elementary step p about every 5 minutes. If we also consider that each pile can have as many as 40 plates 18, we shall see that the hourly productivity of the device 10 can reach about 480 circuits. This is high productivity, obtained with a single drying module 14 with a length l of only 540 mm, in the event that the supports 12 are no bigger than 10"×10", or about 254×254 mm.

Figure 14:
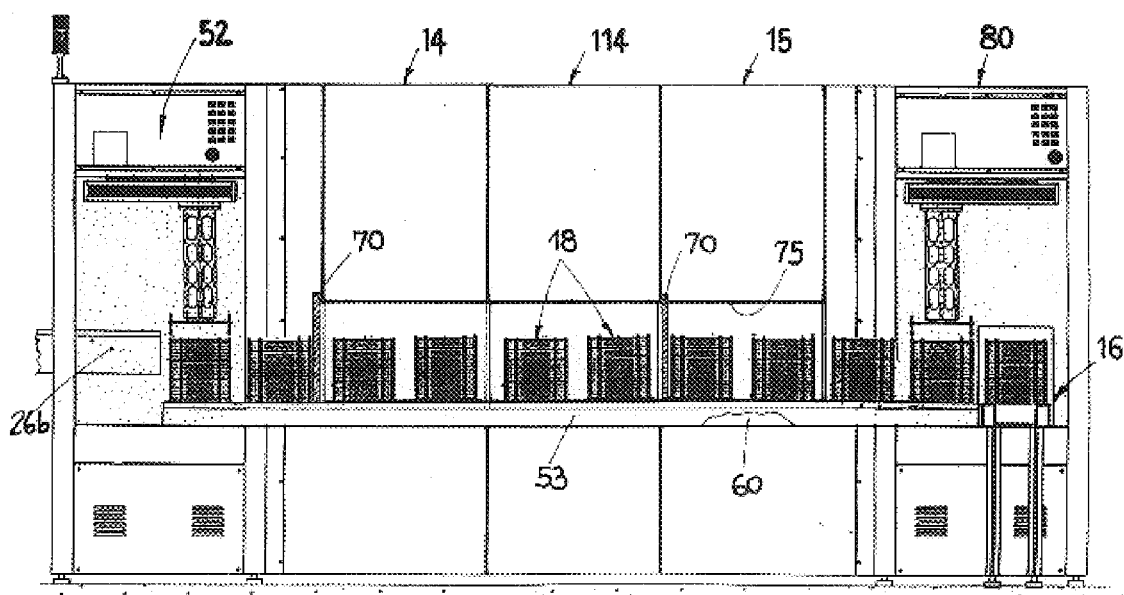
FIG. 14 is a variant of FIG. 13.

If we want to double the productivity of the device 10, for example with the piles of plates 18 being fed by an elementary step every two and a half minutes, to maintain the total time the plates 18 stay inside the oven 14 at around ten minutes, it is sufficient to install a device 10 with two identical drying modules 14 and 114, adjacent to each other (FIG. 14).

To triple the productivity, it will be sufficient to put three drying modules 14 in series, and so on.

Figure 16:
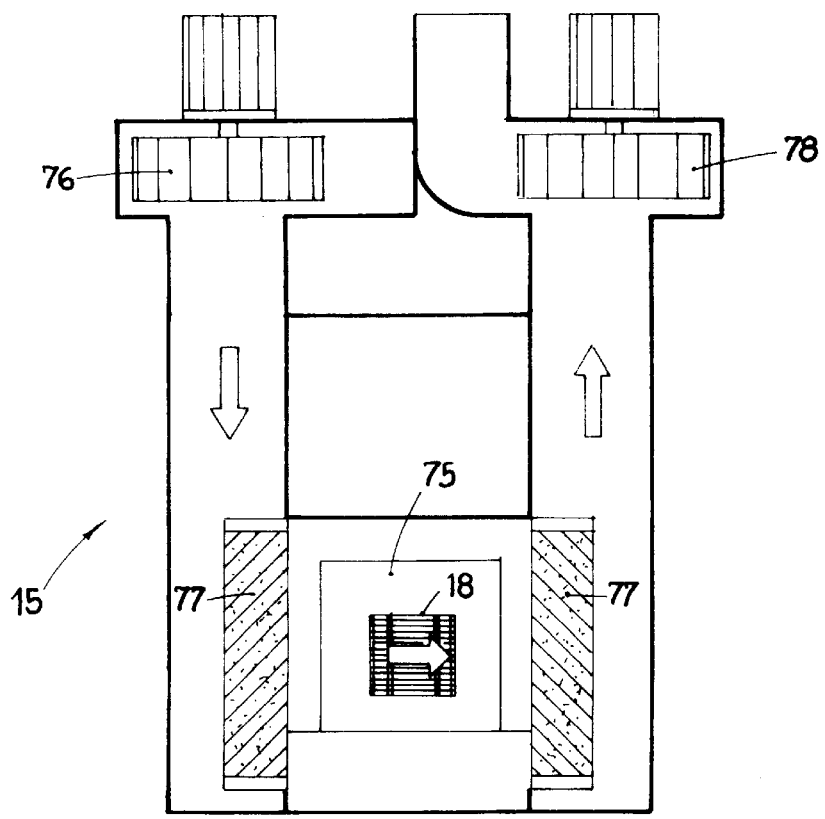
FIG. 16 is a transverse view of a cooling unit of the device in FIG. 1.

The cooling unit or module 15 comprises a central cooling chamber 75 (FIGS. 13 and 16), also substantially cubic, with a length substantially equal to that of a drying module 14. The cooling module 15 also comprises a first electric ventilator 76, emitting air, and a second electric ventilator 78, inspiring air, together able to create a current of air in a transverse direction inside the chamber 75. The cooling module 15 also comprises a pair of vertical filters 77 arranged at the side of the central cooling chamber 75.

The supporting plates 18 and the relative supports 12 are able to stay inside the cooling unit 15 for about ten minutes, so that they can be suitably cooled before being handled by the workers responsible for removing them.

Although the cooling modules 15 can also be positioned adjacent to each other when high productivity is required, practical experiments have shown that a single cooling module 15, thanks to the power of the electric fan 76, is sufficient to adequately cool the piles of plates 18 even when, upstream, two or more drying modules 14 are included.

The collection station 16 comprises horizontal guides 79 (FIGS. 2 and 13) arranged transverse to the guides 53 and a pick-up device 80, similar to the stacking device 52, able to pick up the plates 18 one after the other from the pile emerging from the cooling unit 15, in order to deposit them on the guides 26, in the form of other piles, so that they can subsequently be moved by the workers.

The collection device 80 comprises a trolley 81 able to slide horizontally on an upper bar 82, on the command of a linear motor 83, between a pick-up position and an adjacent collection position, not shown in the drawings.

A linear motor 84 is mounted on the trolley 81, able to vertically displace a lower plate 85 provided with suckers 86, connected with a pneumatic mechanism of a conventional type and not shown in the drawings. Like the suckers 34, the suckers 86 are also able to selectively adhere to the plate 18 which is to be picked up from the guide 53, cooperating with the perimeter zones where the support 12 does not rest.

The device 10 (FIGS. 1 and 2) also comprises, optionally, a punching station 90, where the supports 12 are able to be punched in a conventional manner by means of a punching machine 91.

It is obvious that modifications and additions may be made to the device to produce electronic circuits as described heretofore, but these shall remain within the field and scope of this invention.

For example, instead of being stacked by means of the plates 18 and the relative spacers 20, the base supports 12 could be inserted into pre-shaped containers, provided with grooves made on the inner faces of the side walls, as described in the Italian Patent n. 1.259.732 granted to the same Applicant on Mar. 26, 1996.

What is claimed is:

1. A device to produce electronic circuits of the type that includes at least a flexible base support (12) on which electrically conductive material is deposited to create conductor tracks, said device comprising at least:
    a printing station (13) that deposits said electrically conductive material on said flexible base support (12),
    a drying oven (14), and
    first and second feeding means (35, 60) to feed the base support (12) from said printing station (13) to said drying oven (14),
    wherein a rigid supporting plate (18) is provided to temporarily and removably support a single flexible base support (12), wherein stacking means (52) are provided between said printing station (13) and said drying oven (14) to temporarily and removably stack a plurality of said rigid supporting plates (18) one on top of the other, each rigid supporting plate (18) having an associated flexible base support (12) resting thereon so that a plurality of said flexible base supports (12) are stacked spaced apart from one another in vertical piles before being introduced into said drying oven (14), wherein each rigid supporting plate (18) is provided with spacer elements (20) to separate said rigid supporting plates (18) from each other by a predetermined distance when said rigid supporting plates (18) are temporarily stacked in vertical piles by the stacking means (52), and wherein said first feeding means (35) feed each vertical pile of said flexible base supports (12) one at a time from said stacking means (52) to the drying oven (14) and through the drying oven (14).

2. The device as in claim 1, characterized in that said drying oven (14) comprises a drying chamber (65) inside which at least a pile of base supports (12) is inserted, means being provided to make a current of hot air circulate in a direction transverse to said pile of base supports (12), so that said multiple base supports (12) can be dried simultaneously.

3. The device as in claim 2, characterized in that said drying oven (14) comprises at least a vertical filter (69) arranged in correspondence with the inlet of said current of hot air into said drying chamber (65).

4. The device as in claim 2, characterized in that said drying chamber (65) is able to accommodate at least two piles of base supports (12) arranged in a longitudinal direction that is orthogonal to said current of hot air.

5. The device as in claim 1, characterized in that said drying oven (14) is of the modular type, each module comprising a drying chamber (65) inside which at least one pile of base supports (12) is able to be inserted, two or more different modules being located adjacent to each other so that the drying chambers (65) of the different modules are aligned in a longitudinal direction that is in the direction of feed of said multiple base supports (12).

6. The device as in claim 1, characterized in that said first feed means comprise at least a first horizontal guide (53) and a feed bar (60) that simultaneously feeds, step by step, said piles of base supports (12) in a longitudinal direction through said drying oven (14).

7. The device as in claim 4, characterized in that a length (l) of said drying chamber (65) is substantially double a feed step (p) of said at least two piles of base supports (12).

8. The device as in claim 1, characterized in that downstream of said drying oven (14) is a cooling unit (15) wherein each pile of said base supports (12) is fed by said first feed means through the cooling unit (15) in order to cool said multiple base supports (12).

9. The device as in claim 8, characterized in that said cooling unit (15) comprises a cooling chamber (75) inside which at least one pile of base supports (12) is configured to be inserted, means being provided to make a current of cold air circulate in a direction transverse to said pile, so that said multiple base supports (12) are cooled simultaneously.

10. The device as in claim 9, characterized in that said cooling unit (15) comprises at least a vertical filter (77) arranged in correspondence with the inlet of said current of cold air to said cooling chamber (75).

11. The device as in claim 9, characterized in that said cooling unit (15) comprises at least a vertical filter (77) arranged in correspondence with the outlet of said current of cold air in said cooling chamber (75).

12. The device as in claim 1, characterized in that said first feeding means (35) comprise a first rectilinear guide (26) configured to guide said base supports (12) one in front of the other and separated from each other by a determined step (p) from a loading station (11) to said printing station (13) and thence to said drying oven (14), and in that said printing station (13) is laterally displaced with respect to said rectilinear guide (26), transverse feed means (41–44) being provided to move said multiple base supports (12) transversely and one at a time from said rectilinear guide (26) to said printing station (13) and vice versa.

13. The device as in claim 12, characterized in that said transverse feed means (41–44) comprise a bar (41) arranged transverse to said first rectilinear guide (26), a sliding trolley (42) mounted on the bar (41), a linear motor (43) that controls the sliding trolley (42) and pneumatic means (44a, 44b, 45a, 45b) that selectively lift each of said multiple base supports (12).

14. The device as in claim 1, characterized in that said printing station (13) comprises a serigraphy unit (40) able to deposit, according to the serigraphy technique, said electrically conductive material in the form of conductor paste on an upper surface of the base support (12), following a pre-determined pattern or mask in order to create said conductor tracks.

15. The device as in claim 14, characterized in that said printing station (13) comprises a horizontal positioning and centering board (46), that moves along the two horizontal axes (x and y), orthogonal to each other, and that rotates on the horizontal plane with respect to a vertical axis z (rotation φ).

16. The device as in claim 13, characterized in that said pneumatic means comprise a first pneumatic device (44a) able to lift each of said multiple base supports (12) with respect to said rectilinear guide (26) and to deposit each of said multiple base supports (12) on said horizontal positioning and centering board (46) before a serigraphy step, and a second device (44b) able to lift each of said multiple base supports (12) from said horizontal positioning and centering board (46), after the serigraphy step, and to deposit each of said multiple base supports (12) on said rectilinear guide (26).

17. The device as in claim 15, characterized in that electronic TV cameras (50) are provided in correspondence with said board (46) to optically identify determined points of reference located on said base support (12) and to direct said board (46) in the three directions x, y and φ so that said base support (12) is exactly positioned with respect to said serigraphy unit (40).

18. The device as in claim 15, characterized in that two rollers (47 and 48) are rotatably mounted on said board (46) and a strip of paper (49) is wound on said two rollers (47 and 48) to support said base support (12) during a serigraphy step.

19. The device as in claim 18, characterized in that a suction device (51) is provided below the rectilinear segment of said strip of paper (49) and between said two rollers (47 and 48) that holds said base support (12) selectively adherent to said strip of paper (49).

20. The device as in claim 14, characterized in that a weighing unit (61) is associated with said printing station (13) to weigh each of said multiple base supports (12) both before and after the conductive paste is deposited, to check that the weight of the material deposited corresponds exactly to a pre-set weight.

21. The device as in claim 12, characterized in that said loading station (11) comprises at least a rectilinear guide (25) arranged transverse with respect to said first rectilinear guide (26) and a pick-up device (27) configured to pick up, from a pile of base supports (12) to be treated, the base support (12) which is momentarily on top, in order to deposit the base support (12) on one end of said first rectilinear guide (26).

22. The device as in claim 21, characterized in that said pickup device (27) comprises a trolley (30) moveably mounted to slide horizontally between a pick-up position and a release position, sucker means (34) which are selectively activated to lift and release each of said multiple base supports (12) and drive means (32) associated with said trolley (30) that vertically displace the sucker means (34).

23. The device as in claim 1, characterized in that said first and second feeding means (35, 60) comprise a first rectilinear guide (26) configured to guide said multiple base supports (12), one in front of the other and separated from each other by a determined step (p), from said printing station (13) to said stacking means (52) and a second rectilinear guide (53) that guides piles of base supports (12), one in front of the other and separated from each other by said determined step (p), from said stacking means (52) to a collection station (16) through said drying oven (14).

24. The device as in claim 23, characterized in that said stacking means (52) comprise a trolley (54) that slides transversely with respect to said two guides (26, 53), sucker means (59) which are selectively activated to lift and release each of said base supports (12) and drive means (57) associated with said trolley (54) that vertically displace the sucker means (59).

25. The device as in claim 1, characterized in that a control station (62) is located between said printing station (13) and said drying oven (14) and the control station (62) comprises means (63) rotating around a vertical axis (64) and provided with suckers which are selectively activated to selectively pick up a base support (12) from said first feed means and take the base support (12) with a rotation of 180° around said vertical axis (64) to a control position so that the base support (12) is removed manually.

* * * * *